(12) United States Patent
Nagadomi

(10) Patent No.: US 11,749,352 B2
(45) Date of Patent: Sep. 5, 2023

(54) NON-VOLATILE SEMICONDUCTOR MEMORY DEVICE AND MEMORY SYSTEM

(71) Applicant: Kioxia Corporation, Tokyo (JP)

(72) Inventor: Yasushi Nagadomi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 203 days.

(21) Appl. No.: 17/230,032

(22) Filed: Apr. 14, 2021

(65) Prior Publication Data

US 2021/0233590 A1 Jul. 29, 2021

Related U.S. Application Data

(63) Continuation of application No. 16/713,091, filed on Dec. 13, 2019, now Pat. No. 11,011,235, which is a (Continued)

(30) Foreign Application Priority Data

Jul. 14, 2011 (JP) ................................ 2011-155396

(51) Int. Cl.
*G11C 11/34* (2006.01)
*G11C 16/14* (2006.01)
(Continued)

(52) U.S. Cl.
CPC .......... *G11C 16/14* (2013.01); *G11C 11/5628* (2013.01); *G11C 16/0483* (2013.01);
(Continued)

(58) Field of Classification Search
CPC ..... G11C 16/14; G11C 16/16; G11C 16/3445; G11C 16/344; G11C 7/1078; G11C 7/22; G11C 7/1072; G11C 7/1096
(Continued)

(56) References Cited

U.S. PATENT DOCUMENTS 5,355,464 A 10/1994 Fandrich et al.
5,592,003 A 1/1997 Sato
(Continued)

FOREIGN PATENT DOCUMENTS

CN 1374700 A 10/2002
CN 101650970 A 2/2010
(Continued)

OTHER PUBLICATIONS

Office Action dated Mar. 11, 2014 in Japanese Patent Application No. 2011-155396 (w/English translation).
(Continued)

*Primary Examiner* — Son T Dinh
(74) *Attorney, Agent, or Firm* — Oblon, McClelland, Maier & Neustadt, L.L.P.

(57) ABSTRACT

A non-volatile semiconductor memory device includes a memory cell array and a control circuit. A control circuit performs an erase operation providing a memory cell with a first threshold voltage level for erasing data of a memory cell, and then perform a plurality of first write operations providing a memory cell with a second threshold voltage level, the second threshold voltage level being higher than the first threshold voltage level and being positive level. When the control circuit receives a first execution instruction from outside during the first write operations, the first execution instruction being for performing first function
(Continued)

operation except for the erase operation and the first write operations, the circuit performs the first function operation during the first write operations.

11 Claims, 18 Drawing Sheets

Related U.S. Application Data continuation of application No. 16/238,682, filed on Jan. 3, 2019, now Pat. No. 10,546,643, which is a continuation of application No. 15/923,282, filed on Mar. 16, 2018, now Pat. No. 10,176,877, which is a continuation of application No. 15/361,778, filed on Nov. 28, 2016, now Pat. No. 9,947,411, which is a continuation of application No. 15/074,190, filed on Mar. 18, 2016, now Pat. No. 9,583,200, which is a continuation of application No. 14/748,351, filed on Jun. 24, 2015, now Pat. No. 9,330,772, which is a continuation of application No. 14/093,108, filed on Nov. 29, 2013, now Pat. No. 9,076,536, which is a continuation of application No. 13/425,818, filed on Mar. 21, 2012, now Pat. No. 8,649,225.

(51) Int. Cl.
| | |
|---|---|
| *G11C 11/56* | (2006.01) |
| *G11C 16/04* | (2006.01) |
| *G11C 16/06* | (2006.01) |
| *G11C 16/10* | (2006.01) |
| *G11C 16/08* | (2006.01) |
| *G11C 16/26* | (2006.01) |
| *G11C 16/34* | (2006.01) |

(52) U.S. Cl.
CPC .............. *G11C 16/06* (2013.01); *G11C 16/08* (2013.01); *G11C 16/10* (2013.01); *G11C 16/26* (2013.01); *G11C 16/3459* (2013.01)

(58) Field of Classification Search
USPC .................... 365/185.29, 185.17, 185.22
See application file for complete search history.

(56) References Cited

U.S. PATENT DOCUMENTS

| | | | |
|---|---|---|---|
| 6,815,231 B2 | 11/2004 | Miura | |
| 6,894,931 B2* | 5/2005 | Yaegashi | G11C 16/0466 365/185.27 |
| 8,017,993 B2 | 9/2011 | Kidoh et al. | |
| 8,089,120 B2 | 1/2012 | Tanaka et al. | |
| 8,115,245 B2 | 2/2012 | Yoshimizu et al. | |
| 8,194,467 B2 | 6/2012 | Mikarjiri | |
| 8,374,033 B2 | 2/2013 | Kito et al. | |
| 8,649,225 B2* | 2/2014 | Nagadomi | G11C 16/06 365/185.24 |
| 9,076,536 B2 | 7/2015 | Nagadomi | |
| 9,330,772 B2 | 5/2016 | Nagadomi | |
| 10,546,643 B2 | 1/2020 | Nagadomi | |
| 2006/0087893 A1 | 4/2006 | Nishihara et al. | |
| 2007/0252201 A1 | 11/2007 | Kito | |
| 2009/0129157 A1 | 5/2009 | Honda et al. | |
| 2009/0230459 A1 | 9/2009 | Kito et al. | |
| 2010/0169546 A1 | 7/2010 | Van Acht et al. | |
| 2010/0214838 A1* | 8/2010 | Hishida | G11C 16/14 365/185.11 |
| 2011/0002172 A1 | 1/2011 | Kito et al. | |
| 2012/0044764 A1 | 2/2012 | Nakai | |
| 2013/0121081 A1 | 5/2013 | Kito et al. | |

FOREIGN PATENT DOCUMENTS

| | | |
|---|---|---|
| JP | 2003-100088 | 4/2003 |
| JP | 2008-34045 | 2/2008 |
| JP | 2009-230818 | 10/2009 |
| JP | 2010-161132 | 7/2010 |
| JP | 2011-14817 | 1/2011 |

OTHER PUBLICATIONS

Office Action dated Dec. 3, 2014 in Chinese Patent Application No. 201210055072.7 (w/English translation).

* cited by examiner

FIG. 11

ERASE STATUS ST

| I/O7 | I/O6 | I/O5 | I/O4 | I/O3 | I/O2 | I/O1 | I/O0 |
|---|---|---|---|---|---|---|---|
| - | - | - | - | - | ALL MTr1~8 EP Program Pass/Fail | ALL MTr1~8 EP Program Completed/Not | Erase Pass/Fail |

FIG. 14

ERASE STATUS ST(1)

| I/O7 | I/O6 | I/O5 | I/O4 | I/O3 | I/O2 | I/O1 | I/O0 |
|---|---|---|---|---|---|---|---|
| - | - | - | - | - | - | - | Erase Pass/Fail |

ERASE STATUS ST(2)

| I/O7 | I/O6 | I/O5 | I/O4 | I/O3 | I/O2 | I/O1 | I/O0 |
|---|---|---|---|---|---|---|---|
| - | - | - | - | - | - | MTr1 EP Program Pass/Fail | MTr1 EP Program Completed |

NON-VOLATILE SEMICONDUCTOR MEMORY DEVICE AND MEMORY SYSTEM

CROSS-REFERENCE TO RELATED APPLICATIONS

This application is a continuation of and claims the benefit of priority under 35 U.S.C. § 120 from U.S. application Ser. No. 16/713,091 filed Dec. 13, 2019, which is a continuation of U.S. application Ser. No. 16/238,682 filed Jan. 3, 2019 (now U.S. Pat. No. 10,546,643 issued Jan. 28, 2020), which is a continuation of U.S. application Ser. No. 15/923,282 filed Mar. 16, 2018 (now U.S. Pat. No. 10,176,877 issued Jan. 8, 2019), which is a continuation of U.S. application Ser. No. 15/361,778 filed Nov. 28, 2016 (now U.S. Pat. No. 9,947,411 issued Apr. 17, 2018), which is a continuation of U.S. application Ser. No. 15/074,190 filed Mar. 18, 2016 (now U.S. Pat. No. 9,583,200 issued Feb. 28, 2017), which is a continuation of U.S. application Ser. No. 14/748,351 filed Jun. 24, 2015 (now U.S. Pat. No. 9,330,772 issued May 3, 2016), which is a continuation of U.S. application Ser. No. 14/093,108 filed Nov. 29, 2013 (now U.S. Pat. No. 9,076,536 issued Jul. 7, 2015), which is a continuation of U.S. application Ser. No. 13/425,818 filed Mar. 21, 2012 (now U.S. Pat. No. 8,649,225 issued Feb. 11, 2014), and claims the benefit of priority under 35 U.S.C. § 119 from Japanese Patent Application No. 2011-155396 filed Jul. 14, 2011, the entire contents of each of which are incorporated herein by reference.

FIELD

The embodiments relate to a non-volatile semiconductor memory device and a memory system.

BACKGROUND

In recent years, for a more integrated memory cell, a number of semiconductor memory devices (stacked non-volatile semiconductor memory devices) including three-dimensionally arranged memory cells have been proposed.

BRIEF DESCRIPTION OF THE DRAWINGS

FIG. 11 illustrates an erase status ST according to the first embodiment.

FIG. 14 illustrates erase statuses ST(1) and ST(2) according to the second embodiment.

DETAILED DESCRIPTION

Figure 1:
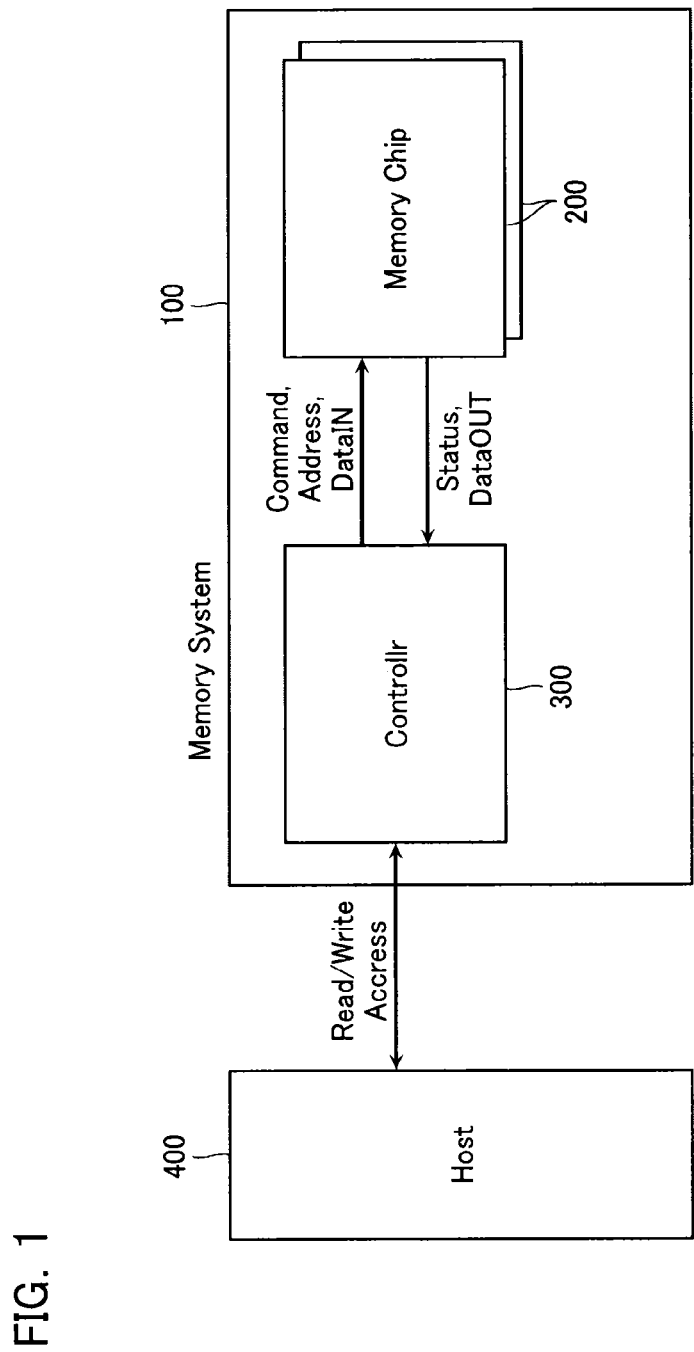
FIG. 1 is a block diagram of a non-volatile memory system 100 according to a first embodiment.

A non-volatile semiconductor memory device according to an aspect includes a memory cell array and a control circuit. The memory cell array includes a plurality of memory cells, and a plurality of word-lines commonly connected to gates of the memory cells. The control circuit is configured to perform an erase operation providing a memory cell with a first threshold voltage level for erasing data of a memory cell, and then perform a plurality of first write operations providing a memory cell with a second threshold voltage level, the second threshold voltage level being higher than the first threshold voltage level and being positive level. The memory cell array includes a semiconductor substrate, a first semiconductor layer, a charge accumulation layer, and a first conductive layer. The first semiconductor layer extends in a direction perpendicular to the semiconductor substrate, and functions as a body of a memory cell. The charge accumulation layer is operative to accumulate charges. The first conductive layer sandwiches the charge accumulation layer with the first semiconductor layer, and functions as agates of the memory cell and a word-line. The control circuit performs the first write operation to the plurality of memory cells. When the control circuit receives a first execution instruction from outside during the first write operations, the first execution instruction being for performing first function operation except for the erase operation and the first write operations, the control circuit performs the first function operation during the first write operations.

Referring now to the drawings, non-volatile semiconductor memory devices according to the embodiments will be described.

First Embodiment

[Configuration]

Referring first to FIG. 1, the entire configuration of a non-volatile memory system according to a first embodiment will be described. FIG. 1 is a block diagram of anon-volatile memory system 100 according to the first embodiment of the present invention.

With reference to FIG. 1, the non-volatile memory system 100 includes a plurality of NAND memory chips 200

(non-volatile semiconductor memory devices), and a controller 300 for controlling the memory chips 200. The controller 300 operates in response to a control signal from an external host computer 400. The controller 300 accesses the memory chips 200 and instructs them to perform data read, data write, data erase, or the like.

Figure 2:
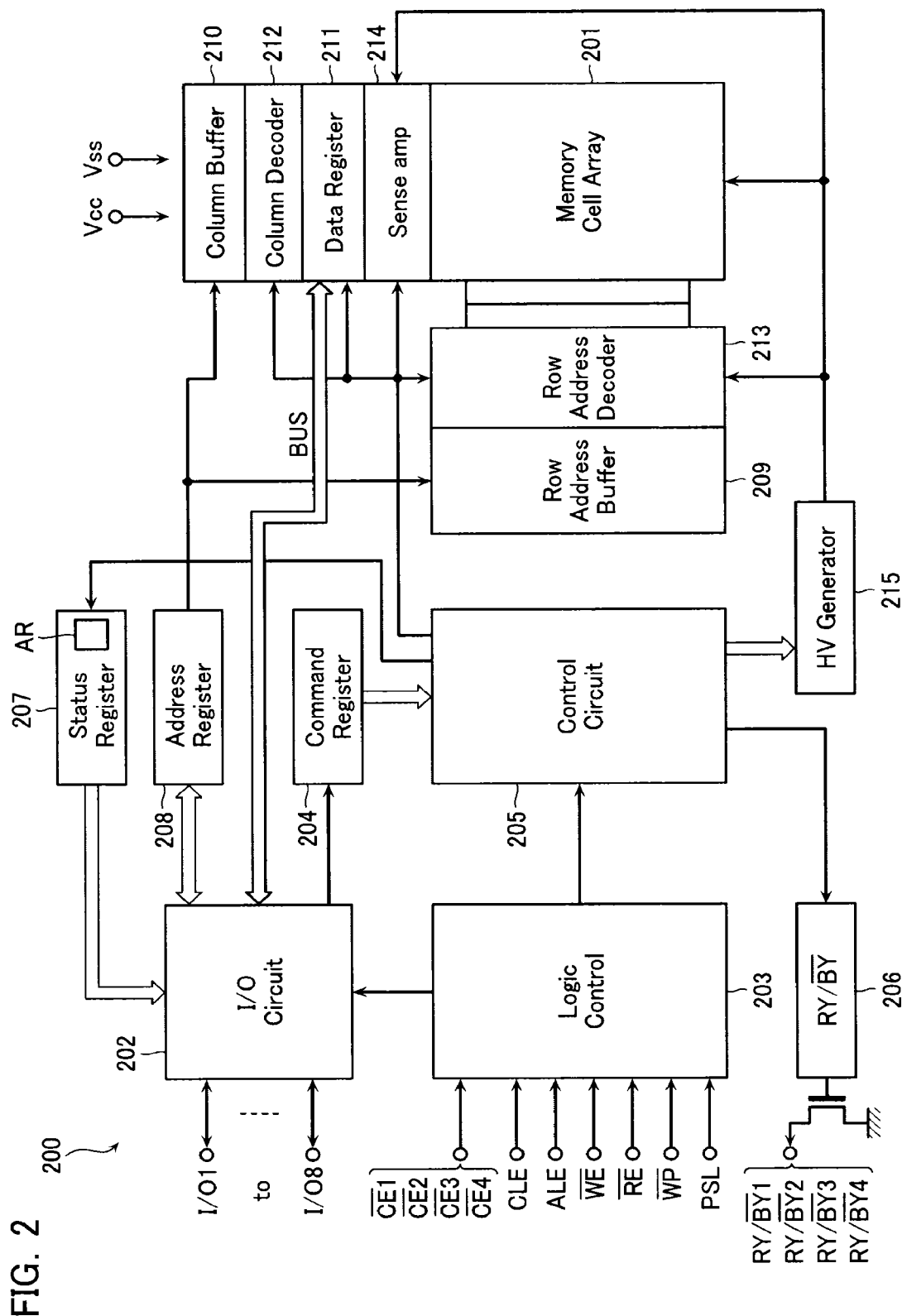
FIG. 2 is a block diagram of a memory chip 200 according to the first embodiment.

Referring now to FIG. 2, the specific configuration of each memory chip 200 will be described. With reference to FIG. 2, each memory chip 200 includes a memory cell array 201 for storing data in a non-volatile manner, and various circuits 202 to 215 for controlling the memory cell array 201.

The input/output circuit 202 inputs/outputs a command, an address, and data via an input/output data I/O. The input/output circuit 202 is connected to a command register 204, a status register 207, an address register 208, and a data register 211, as described below.

A logic circuit 203 receives a chip enable signals /CE1 to /CE4, a command latch enable signal CLE, an address latch enable signal ALE, a write-enable signal /WE, a read-enable signal /RE, a write protect signal /WP, a selection control signal PSL, and other control signals. The logic circuit 203 controls the memory cell array 201 according to those signals. The logic circuit 203 is connected to the input/output circuit 202 and a control circuit 205 as described below. A command register 204 decodes a command that is input to the input/output circuit 202. The command register 204 is connected to the control circuit 205 as described below.

The control circuit 205 performs the data transfer control and the sequence control of the data write/erase/read. The control circuit 205 is connected to status registers 206 and 207, a data register 211, a column decoder 212, a sense amplifier 214, and a high voltage generation circuit 215, as described below.

The status register 206 (which shows RY//BY in FIG. 2 and may hereinafter be referred to as a first status register) outputs a signal to the Ready/Busy terminal that shows the Ready/Busy state of the memory chip 200. The status register 207 (which may hereinafter be referred to as a second status register) receives a signal from the control circuit 205 that shows the state (such as Pass/Fail and Ready/Busy) of the memory chip 200, and outputs the signal to the host computer 400 via the input/output circuit 202.

The status register 207 includes a region AR for holding an interruption information. The interruption information is information that is input from the control circuit 205. The interruption information is input from the control circuit 205 when the first write operations are performed to all memory transistors MTr and an interrupt operation occurs before the first write operations are completed. The interruption information will be described in more detail below.

A row address buffer 209 and a column address buffer 210 receive address data via the address register 208 and transfer it. The row address buffer 209 is connected to a row decoder 213 as described below. The column address buffer 210 is connected to a column decoder 212 as described below.

The data register 211 has functions of temporarily holding write data to the memory cell array 201 and of temporarily holding read data from the memory cell array 201. The write data is transferred to the data register 211 via the input/output circuit 202 and a data bus BUS.

The column decoder 212 and the row decoder 213 perform a control of selecting, according to address data supplied from the row address buffer 209 and the column address buffer 210, a word-line WL, a bit-line BL, a source-line SL, and the like in the memory cell array 201 as described below, and applying desired voltages to them. The sense amplifier 214 senses and amplifies the voltage of the bit-line BL, and reads data from the memory cell array 201.

The high voltage generation circuit 215 generates the desired high voltage for each operation mode. The high voltage generation circuit 215 generates a predetermined high voltage according to an instruction provided from the control circuit 205. The high voltage generation circuit 215 is connected to the memory cell array 201, the row decoder 213, and the sense amplifier 214.

Figure 3:
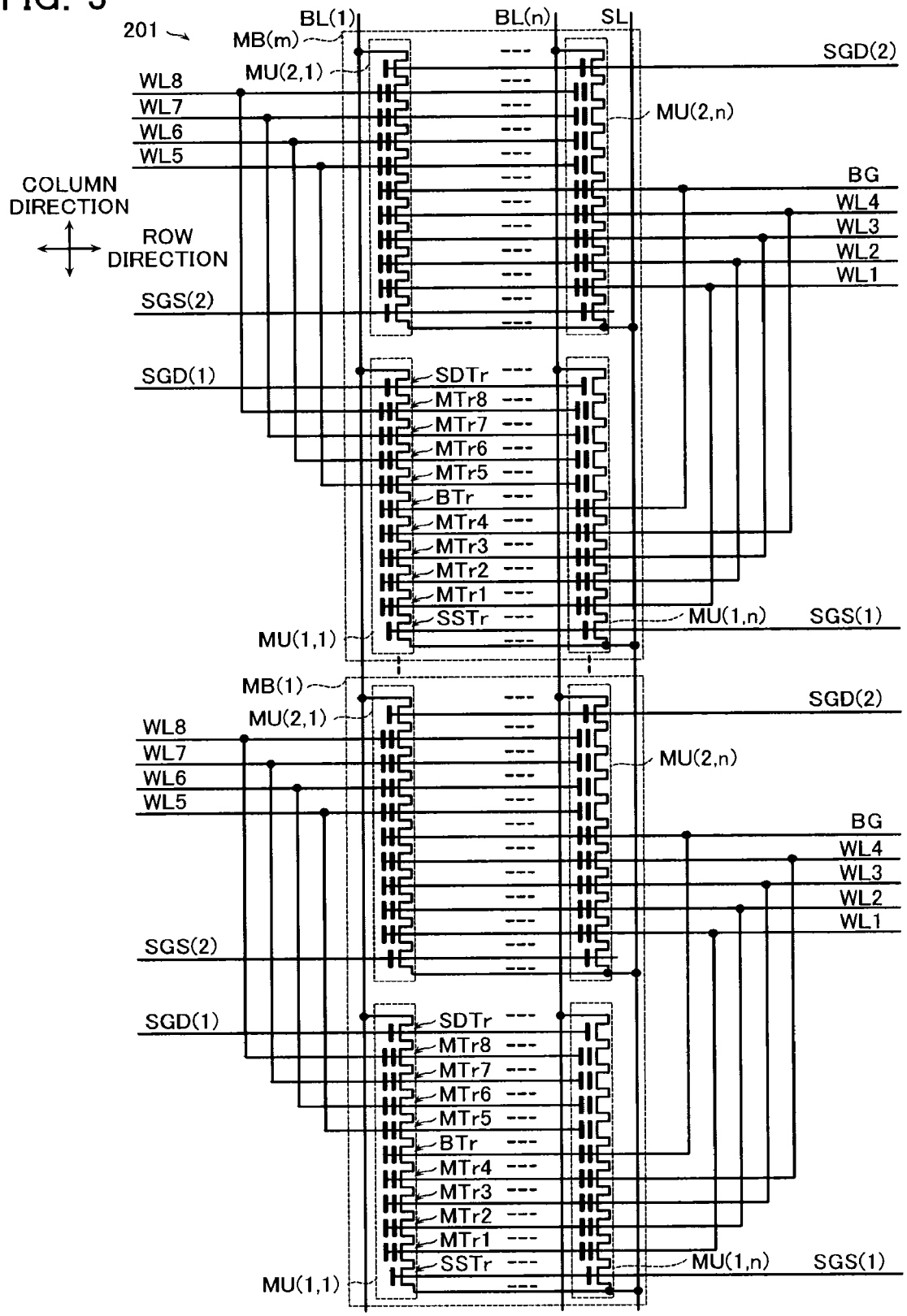
FIG. 3 is a circuit diagram of a memory cell array 201 according to the first embodiment.

Referring now to FIG. 3, the circuitry of the memory cell array 201 will be specifically described.

With reference to FIG. 3, the memory cell array 201 includes m memory blocks MB(1), . . . , MB(m). Note that all memory blocks MB(1), . . . , MB(m) may hereinafter be collectively described as a memory block MB.

Each memory block MB includes memory units MU(1, 1) to MU(2, n) arranged in a matrix of n-rows and 2 columns. The n-rows and 2 columns are merely an example, and the invention is not limited thereto. Each of the memory units MU(1, 1) to MU(2, n) may hereinafter be described merely as a memory unit MU without distinction.

First ends of the memory units MU(1, 1) to MU(2, n) are connected to bit-lines BL(1) to BL(n). Second ends of the memory units MU(1, 1) to MU(2, n) are connected to a source-line SL. The bit-lines BL(1) to BL(n) are provided in the row direction at a predetermined pitch and extend in the column direction over the memory blocks MB. All bit-lines BL(1), . . . , BL(n) may hereinafter be collectively described as a bit-line BL.

The memory unit MU includes a memory string MS, a source-side select transistor SSTr, and a drain-side select transistor SDTr.

With reference to FIG. 3, the memory string MS includes memory transistors MTr1 to MTr8 (memory cells) connected in series and a back gate transistor BTr. The memory transistors MTr1 to MTr4 and MTr5 to MTr8 are connected in series, respectively. Note that the memory transistors MTr1 to MTr8 are arranged in the stacking direction, as described below in FIG. 4 and FIG. 5. The back gate transistor BTr is connected between the memory transistor MTr4 and the memory transistor MTr5.

The memory transistors MTr1 to MTr8 accumulate charge in their charge accumulation layers to hold data. The back gate transistor BTr is rendered conductive when at least the memory string MS is selected as an operation target.

In each of the memory blocks MB(1) to MB(m), gates of the memory transistors MTr1 to MTr8 arranged in n-rows and 2 columns are commonly connected to respective word-lines WL1 to WL8. Gates of the back gate transistors BTr arranged in n-rows and 2 columns are commonly connected to a back gate line BG.

The source-side select transistor SSTr has a drain connected to a source of the memory string MS. The source-side select transistor SSTr has a source connected to the source-line SL. In each memory block MB, gates of the n source-side select transistors SSTr aligned in the row direction are commonly connected to one source-side select gate line SGS(1) or SGS(2). Note that the source-side select gate lines SGS(1) and SGS(2) may hereinafter be collectively referred to as a source-side select gate line SGS without distinction.

The drain-side select transistor SDTr has a source connected to a drain of the memory string MS. The drain-side select transistor SDTr has a drain connected to the bit-line BL. In each memory block MB, gates of the n drain-side select transistors SDTr aligned in the row direction are commonly connected to one drain-side select gate line SGD(1) or SGD(2). Note that the, drain-side select gate lines SGD(1) and SGD(2) may hereinafter be collectively referred to as a drain-side select gate line SGD without distinction.

[Stacked Structure]

Figure 4:
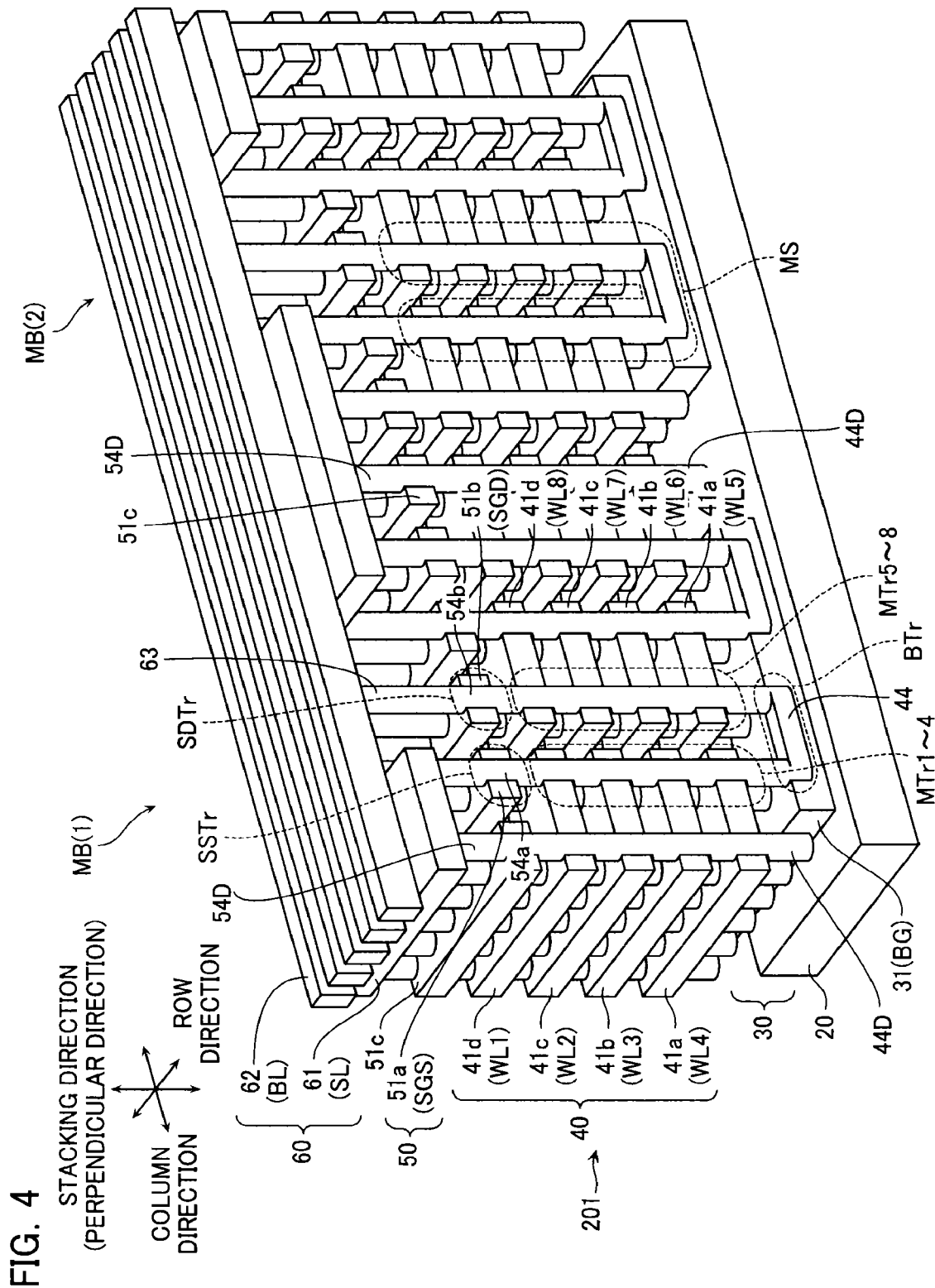
FIG. 4 is a schematic perspective view of the memory cell array 201 according to the first embodiment.
Figure 5:
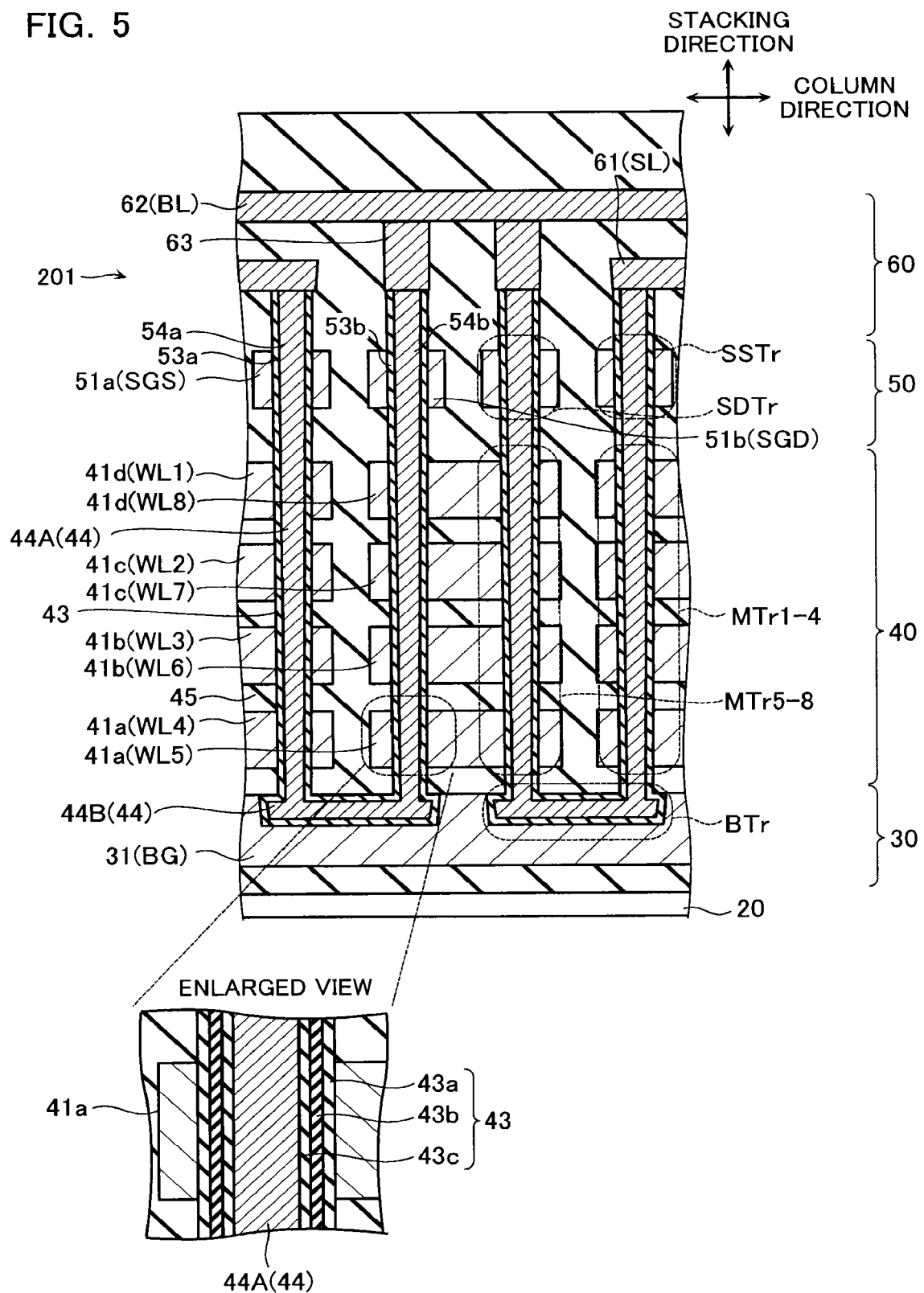
FIG. 5 is a cross-sectional view of the memory cell array 201 according to the first embodiment.

With reference to FIG. 4 and FIG. 5, one memory block MB includes a back gate layer 30, a memory layer 40, a select transistor layer 50, and a wiring layer 60, which are sequentially stacked on a substrate 20. The back gate layer 30 functions as the back gate transistors BTr. The memory layer 40 functions as the memory transistors MTr1 to MTr8. The select transistor layer 50 functions as the drain-side select transistors SDTr and the source-side select transistors SSTr. The wiring layer 60 functions as the source-line SL and the bit-line BL.

With reference to FIG. 4 and FIG. 5, the back gate layer 30 includes a back gate conductive layer 31. The back gate conductive layer 31 functions as the back gate line BG and as the gates of the back gate transistors BTr. The back gate conductive layer 31 extends two-dimensionally like a plate in the row and column directions parallel to the semiconductor substrate 20. The back gate conductive layer 31 is made of a material such as polysilicon (poly-Si).

With reference to FIG. 5, the back gate layer 30 includes a memory gate insulating layer 43 and a joining semiconductor layer 44B. The memory gate insulating layer 43 is provided between the joining semiconductor layer 44B and the back gate conductive layer 31. The joining semiconductor layer 44B functions as a body (channel) of the back gate transistor BTr. The joining semiconductor layer 44B trims the back gate conductive layer 31. The joining semiconductor layer 44B is formed in a generally rectangular shape having a longitudinal direction in the column direction when viewed in top plan view. A plurality of joining semiconductor layers 44B are formed in a matrix in the row and column directions in one memory block MB. Each joining semiconductor layer 44B is made of a material such as polysilicon (poly-Si).

With reference to FIG. 4 and FIG. 5, the memory layer 40 is formed in a layer above the back gate layer 30. The memory layer 40 includes four word-line conductive layers 41a to 41d. The word-line conductive layer 41a functions as the word-line WL4 and as the gates of the memory transistors MTr4. The word-line conductive layer 41a also functions as the word-line WL5 and as the gates of the memory transistors MTr5. Likewise, the word-line conductive layers 41b to 41d function as the respective word-lines WL1 to WL3 and as the respective gates of the memory transistors MTr1 to MTr3. The word-line conductive layers 41b to 41d also function as the respective word-lines WL6 to WL8 and as the respective gates of the memory transistors MTr6 to MTr8.

The word-line conductive layers 41a to 41d are stacked with an interlayer insulating layer 45 disposed therebetween. The word-line conductive layers 41a to 41d reside at a certain pitch in the column direction and extend in the row direction (a direction perpendicular the plane of FIG. 3) as the longitudinal direction. The word-line conductive layers 41a to 41d are made of a material such as polysilicon (poly-Si).

With reference to FIGS. 4 and 5, the memory layer 40 includes a memory gate insulating layer 43, a columnar semiconductor layer 44A, and a dummy semiconductor layer 44D. The memory gate insulating layer 43 is provided between the columnar semiconductor layer 44A and the word-line conductive layers 41a to 41d. The columnar semiconductor layer 44A functions as the bodies (channels) of the memory transistors MTr1 to MTr8. The dummy semiconductor layer 44D does not function as the bodies of the memory transistors MTr1 to MTr8.

The memory gate insulating layer 43 includes, from the side surface sides of the word-line conductive layers 41a to 41d to a side of the memory columnar semiconductor layer 44A, a block insulating layer 43a, a charge accumulation layer 43b, and a tunnel insulating layer 43c. The charge accumulation layer 43b is configured to be capable of accumulating charge.

The block insulating layer 43a is formed on the side surfaces of the word-line conductive layers 41a to 41d with a predetermined thickness. The charge accumulation layer 43b is formed on a side surface of the block insulating layer 43a with a predetermined thickness. The tunnel insulating layer 43c is formed on a side surface of the charge accumulation layer 43b with a predetermined thickness. The block insulating layer 43a and the tunnel insulating layer 43c are made of a material such as silicon dioxide ($SiO_2$). The charge accumulation layer 43b is made of a material such as silicon nitride (SiN).

The columnar semiconductor layer 44A passes through the word-line conductive layers 41a to 41d and the interlayer insulating layer 45. The columnar semiconductor layer 44A extends in a direction perpendicular to the semiconductor substrate 20. A pair of columnar semiconductor layers 44A are aligned with the respective end portion vicinities of the joining semiconductor layer 44B in the column direction. The columnar semiconductor layer 44A is made of a material such as polysilicon (poly-Si). Note that the dummy semiconductor layer 44D passes through the word-line conductive layers 41a to 41d and the interlayer insulating layer 45. Under the dummy semiconductor layer 44D, the back gate conductive layer 31 is not provided.

In the above back gate layer 30 and memory layer 40, the pair of columnar semiconductor layers 44A and the joining semiconductor layer 44B joining the lower ends of the columnar semiconductor layers 44A form a memory semiconductor layer 44 functioning as a body (channel) of the memory string MS. The memory semiconductor layer 44 is formed in a U shape when viewed in the row direction.

The above back gate layer 30 has, in other words, a configuration in which the back gate conductive layer 31 surrounds the side surface and bottom surface of the joining semiconductor layer 44B via the memory gate insulating layer 43. Further, the above memory layer 40 has, in other words, a configuration in which the word-line conductive layers 41a to 41d surround the side surface of the columnar semiconductor layer 44A via the memory gate insulating layer 43.

With reference to FIG. 4 and FIG. 5, the select transistor layer 50 includes a source-side conductive layer 51a, a drain-side conductive layer 51b, and a dummy conductive layer 51c. The source-side conductive layer 51a functions as the source-side select gate line SGS and as the gates of the source-side select transistors SSTr. The drain-side conductive layer 51b functions as the drain-side select gate line SGD and as the gates of the drain-side select transistors SDTr. The dummy conductive layer 51c does not function as the source-side select gate line SGS or the drain-side select gate line SGD.

The source-side conductive layer 51a is formed in a layer above one of the first columnar semiconductor layers 44A included in the memory semiconductor layer 44. The drain-side conductive layer 51b is formed in the same layer as the source-side conductive layer 51a. The layer 51b is also formed in a layer above the other one of the columnar semiconductor layers 44A included in the memory semiconductor layer 44. The dummy conductive layer 51c is formed in the same layer as the source-side conductive layer 51a and is formed in a portion other than the portion over the columnar semiconductor layer 44A. More than one source-side conductive layers 51a, drain-side conductive layers 51b, and dummy conductive layers 51c are provided at a predetermined pitch in the column direction and extend in the row direction. The source-side conductive layer 51a and the drain-side conductive layer 51b are made of a material such as polysilicon (poly-Si).

With reference to FIG. 5, the select transistor layer 50 includes a source-side gate insulating layer 53a, a source-side columnar semiconductor layer 54a, a drain-side gate insulating layer 53b, a drain-side columnar semiconductor layer 54b, and a dummy semiconductor layer 54D. The source-side columnar semiconductor layer 54a functions as a body (channel) of the source-side select transistor SSTr. The drain-side columnar semiconductor layer 54b functions as a body (channel) of the drain-side select transistor SDTr.

The source-side gate insulating layer 53a is provided between the source-side conductive layer 51a and the source-side columnar semiconductor layer 54a. The source-side columnar semiconductor layer 54a passes through the source-side conductive layer 51a. The source-side columnar semiconductor layer 54a is connected to a side surface of the source-side gate insulating layer 53a and a top surface of one of the pair of columnar semiconductor layers 44A. The source-side columnar semiconductor layer 54a is formed in a columnar shape extending in a direction perpendicular to the semiconductor substrate 20. The source-side columnar semiconductor layer 54a is made of a material such as polysilicon (poly-Si).

The drain-side gate insulating layer 53b is provided between the drain-side conductive layer 51b and the drain-side columnar semiconductor layer 54b. The drain-side columnar semiconductor layer 54b passes through the drain-side conductive layer 51b. The drain-side columnar semiconductor layer 54b is connected to aside surface of the drain-side gate insulating layer 53b and atop surface of the other one of the pair of columnar semiconductor layers 44A. The drain-side columnar semiconductor layer layer 54b is formed in a columnar shape extending in a direction perpendicular to the semiconductor substrate 20. The drain-side columnar semiconductor layer 54b is made of a material such as polysilicon (poly-Si).

The dummy semiconductor layer 54D passes through the dummy conductive layer 51c. The dummy semiconductor layer 54D is formed in an I shape. A bottom surface of the dummy semiconductor layer 54D is in contact with a top surface of the dummy semiconductor layer 44D.

The wiring layer 60 includes a source-line layer 61, a bit-line layer 62, and a plug layer 63. The source-line layer 61 functions as the source-line SL. The bit-line layer 62 functions as the bit-line BL.

The source-line layer 61 is in contact with a top surface of the source-side columnar semiconductor layer 54a and extends in the row direction. The bit-line layer 62 is in contact with a top surface of the drain-side columnar semiconductor layer 54b via the plug layer 63 and extends in the column direction. The source-line layer 61, the bit-line layer 62, and the plug layer 63 are made of metal material such as tungsten.

[Operations]

Figure 6:
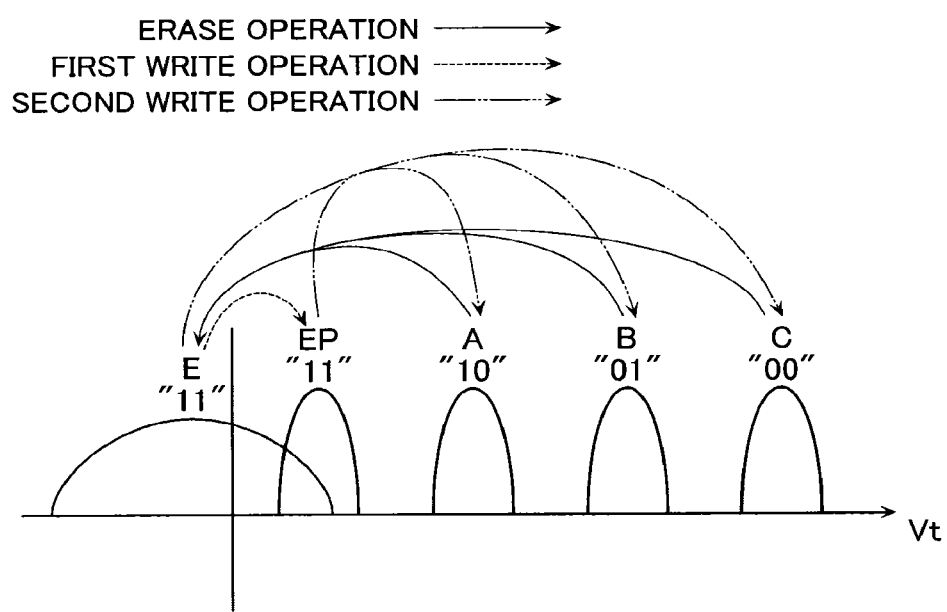
FIG. 6 illustrates a relationship between the threshold voltage distributions of a memory transistor MTr and data according to the first embodiment.

A description is now given of an erase operation, a first write operation, and a second write operation according to the first embodiment. For convenience of description, a 2-bit/cell is described as an example. Specifically, threshold voltage distributions of the memory transistor MTr may include one negative distribution (E) and four positive distributions (EP, A, B, and C). FIG. 6 illustrates a relationship between the 2-bit four-level data (data "11," "10," "01," and "00") stored in the memory transistor MTr and the threshold voltage distributions of the memory transistor MTr. Here, data "11" (E and EP) indicates an erased state and data "10," "01," "00" (A, B, and C) indicate a write state. A lower limit of the threshold voltage distribution E has a negative value. The lower limits of the threshold voltage distributions EP, A, B, and C have positive values. The threshold voltage distributions EP, A, B, and C are arranged in the positive direction at a predetermined margin.

The erase operation causes holes to be trapped in the charge accumulation layer 43b of the memory transistor MTr, thereby moving the threshold voltage distributions EP, A, B, and C in the negative direction to be set to the threshold voltage distribution E. The first write operation is performed after the erase operation. The first write operation causes electrons to be trapped in the charge accumulation layer 43b of the memory transistor MTr, thereby moving the threshold voltage distribution E in the positive direction to be set to the threshold voltage distribution EP.

The second write operation causes electrons to be trapped in the charge accumulation layer 43b of the memory transistor MTr, and moves, depending on the trapped amount, the threshold voltage distribution E or EP in the positive direction to be set to the threshold voltage distribution A, B, or C (A<B<C).

Figure 7:
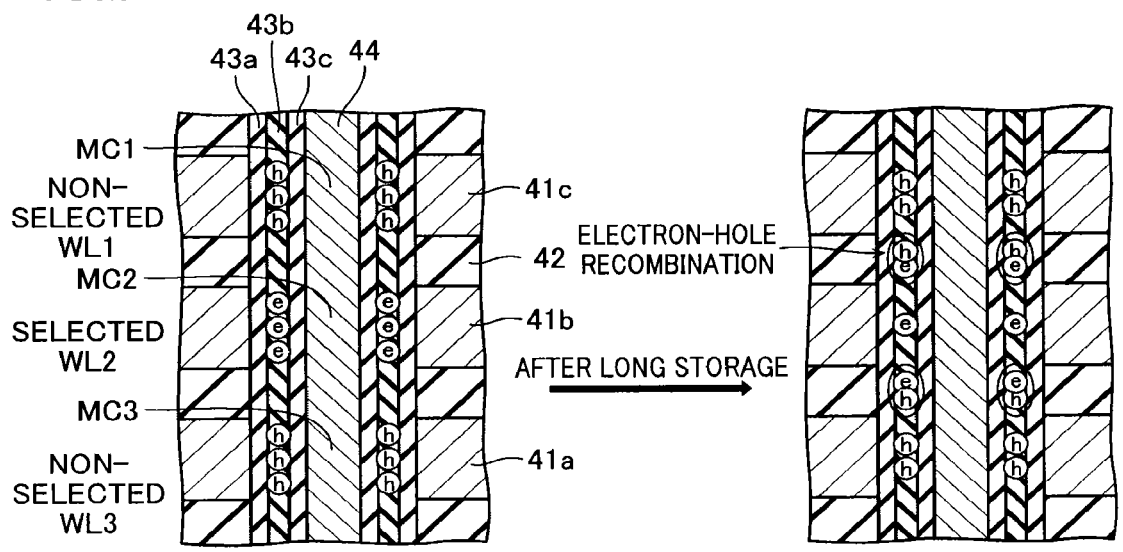
FIG. 7 illustrates the issue if the first write operation is not performed.

The reason for performing the first write operation will now be described. First, referring to FIG. 7, the issue if the first write operation is not performed will be described. The charge accumulation layer 43b is continuous through the memory transistors MTr1 to MTr8. Accordingly, in this case, if one memory transistor MTr has, for example, a threshold voltage distribution A and another memory transistor MTr adjacent to that memory transistor MTr has a threshold voltage distribution E, charges (electrons, holes) move between the adjacent memory transistors MTr1 to MTr8 over time. Specifically, with reference to FIG. 7, it is assumed that after the erase operation is performed, the first write operation is not performed, and the second write operation is performed only to the selected memory transistor MTr2, and other non-selected memory transistors MTr1 and MTr3 to MTr8 remain in the erased state. In this case, the charge accumulation layer 43b of the selected memory transistor MTr2 is in a state in which electrons are trapped, and the charge accumulation layer 43b of the other non-selected memory transistors MTr1 and MTr3 to MTr8 is in a state in which holes are trapped. Thus, between the adjacent memory transistors MTr1, MTr2, and MTr3, charges (electrons, holes) may recombine, thereby losing data of the selected memory transistor MTr2.

Therefore, the non-volatile semiconductor memory device according to the first embodiment performs the first write operation after the erase operation. Thus, with reference to FIG. 8, the charge accumulation layer 43b of the memory transistors MTr1 to MTr8 is in a state in which electrons are trapped regardless of stored data. Therefore, the first embodiment may reduce the charge recombination between the adjacent memory transistors MTr1 to MTr8. As a result, the data loss (degradation) may be reduced.

Figure 8:
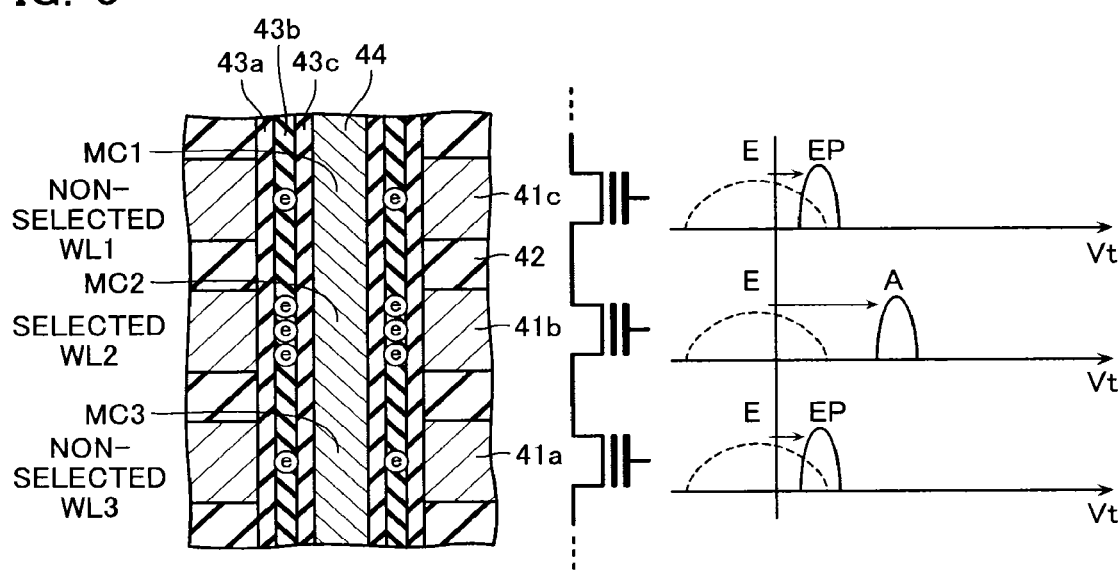
FIG. 8 shows the advantage of the first write operation.

The first write operation described above is performed more than once by the control circuit 205. With reference to FIG. 8, the first write operation is performed once for each of the memory transistors MTr1 to the memory transistors MTr8 commonly connected to the respective word-lines WL1 to WL8. The first write operation is performed in the order of the memory transistors MTr1 to MTr8.

Figure 9:
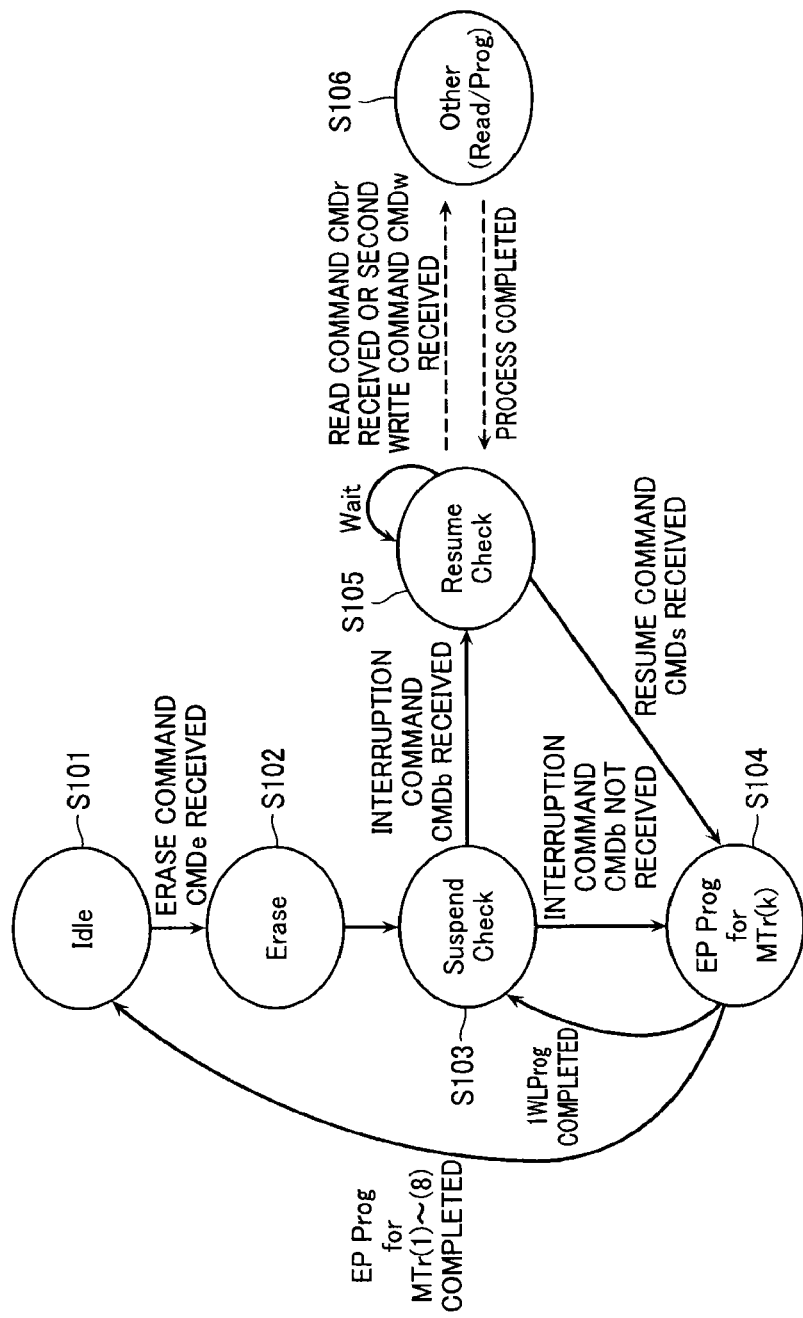
FIG. 9 illustrates a state transition diagram according to the first embodiment.

Referring now to FIG. 9, a schematic operation of the control circuit 205 will be described. After the erase operation, the control circuit 205 performs the first write operations in the idle state (idling) in which various operations such as the second write operation and the read operation are not performed. Then, when an execution command of the second write operation or the read operation (execution command for an operation except for the erase operation and the first write operation) is received during the first write operations, the control circuit 205 performs the second write operation or the read operation (interrupt operation) during the first write operations. Because of the interrupt operation, the first embodiment may rapidly perform the second write operation and the read operation even during the first write operations.

With reference to FIG. 9, the control circuit 205 is typically in the idle state (S101) and receives an erase command CMDe from the controller 300. Here, the erase command CMDe in the first embodiment is a command for performing the erase operation and then successively performing the first write operations. Therefore, when the control circuit 205 receives the erase command CMDe in step S101, it first performs the erase operation (S102), and then performs the successive first write operations (S103 and S104).

Specifically, in step S103, the control circuit 205 checks whether or not there is an interruption command CMDb for interrupting the first write operations. Here, when the interruption command CMDb is not present, the control circuit 205 performs the first write operation to, for example, the memory transistors MTr1 commonly connected to one word-line WL1 (S104). Then, it is checked again whether the interruption command CMDb is present or not (S103). When the interruption command CMDb is not present, the first write operation is performed to the memory transistors MTr2 commonly connected to the one word-line WL2 (S104). Then steps S103 and S104 are repeated, and when it is determined that the first write operations are completed to all memory transistors MTr1 to MTr8, the control circuit 205 returns to the idle state (S101).

In the above step S103, when the interruption command CMDb is present, then the control circuit 205 determines whether or not the other execution command (read command CMDr or write command CMDw), or a resume command CMDs is present (S105). When receiving the other execution command CMDr or CMDw, the control circuit 205 performs that operation (S106), and returns to the process in step S105. In step S105, the control circuit 205 resumes, when it receives the resume command CMDs, the first write operation in response to the resume command CMDs (S104).

Here, it is possible to consider, as a comparative example, a process in which immediately after the erase operation or the second write operation, the first write operations are intermittently performed preferentially than the other operations. In the process in the comparative example, however, the other operations requested in the first write operations are performed after the first write operations are completed. Further, the memory cell array 201 in this embodiment includes three-dimensionally arranged memory transistors MTr1 to MTr8, and thus it has a larger capacity than the conventional memory cell array including two-dimensionally arranged memory transistors. Thus, adoption of the process of the comparative example in this embodiment will dramatically increase the delay time. In this embodiment, therefore, the process shown in FIG. 9 is performed to rapidly perform the second write operation and the read operation even during the first write operations.

Figure 10:
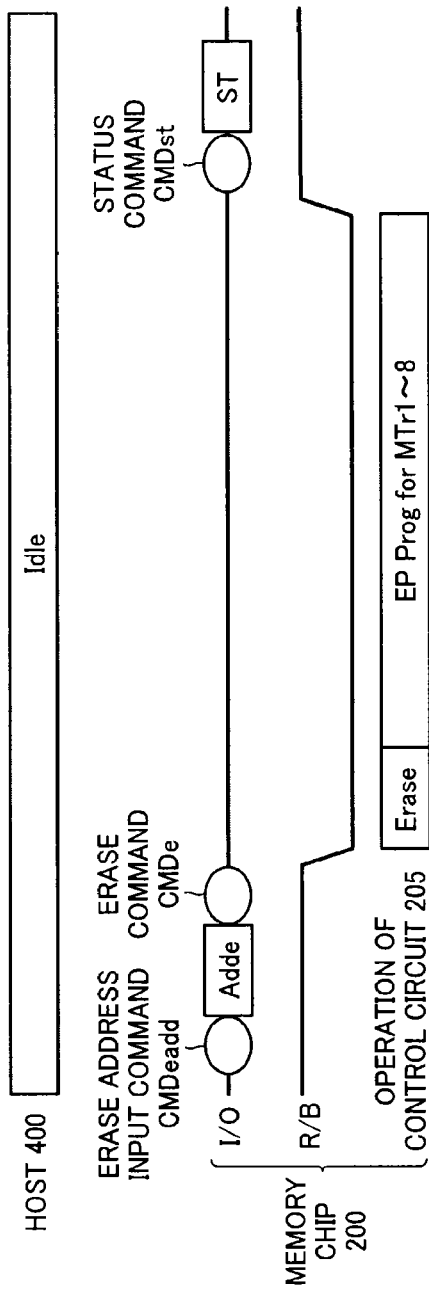
FIG. 10 is a timing diagram of a first write operation according to the first embodiment.

Referring now to FIG. 10, an example is described in which the erase operation and the first write operations are performed without an interruption. With reference to FIG. 10, the control circuit 205 receives, from the controller 300, an erase address input command CMDeadd and an address data ADDe. Then, the control circuit 205 receives the erase command CMDe. Then, the control circuit 205 performs the erase operation to the memory transistor MTr in the address assigned by the erase command CMDe and address data ADDe (Erase). The memory chip 200 enters the busy state. Then, continuously after the erase operation, the control circuit 205 successively performs the first write operations. After the first write operations are completed and the memory chip 200 is in a ready state, the control circuit 205 receives a status command CMDst and outputs the erase status ST to the controller 300 via the status register 207. The controller 300 holds the erase status ST.

The erase status ST is indicated by, for example, 3-bit data. FIG. 11 illustrates the correspondence between the configuration of the erase status ST and I/O0 to I/O7.

The first bit data (corresponding to I/O0) of the erase status ST is data indicating whether the erase operation passes or fails. The second bit data (corresponding to I/O1) is data indicating whether the first write operations are completed or not to all memory cell transistors MTr1 to MTr8 connected to all word-lines WL1 to WL8. Further, the third bit data (corresponding to I/O2) is data indicating whether the first write operations to all memory transistors MTr1 to MTr8 pass or fail. For example, even if the first write operation fails only to one memory transistor MTr1 (only the memory transistor MTr1 is defective), data corresponding to I/O2 "fails." Therefore, data corresponding to I/O2 may identify the defective memory block MB.

Figure 12:
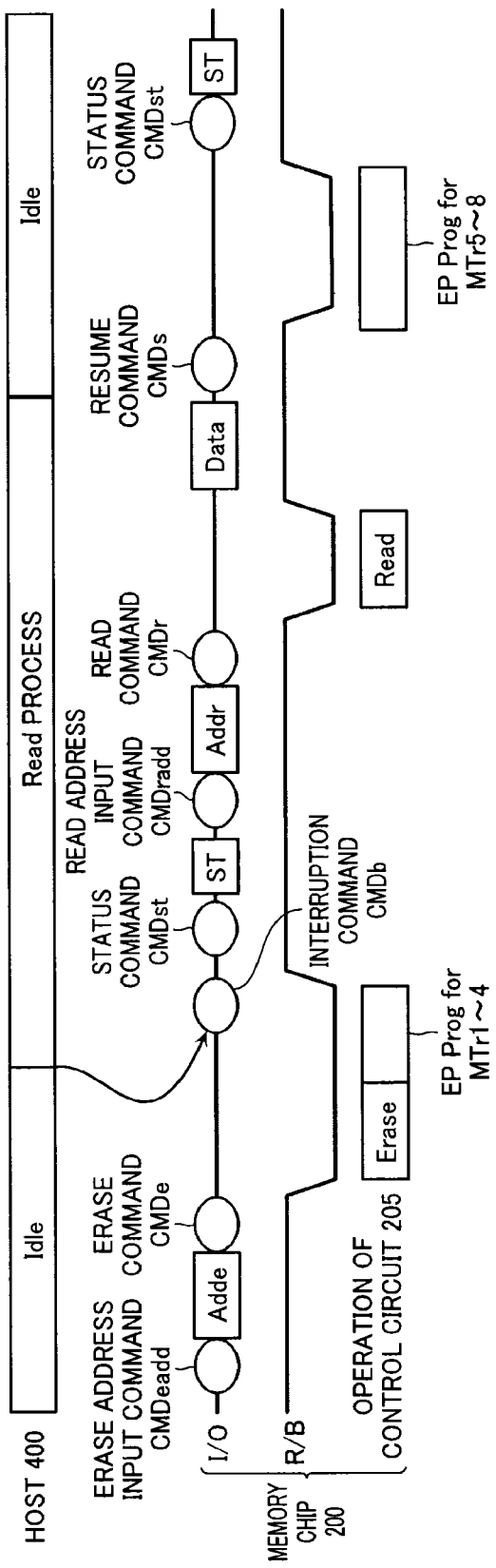
FIG. 12 is the timing diagram of the first write operation according to the first embodiment.

Referring now to FIG. 12, an example is described in which the read operation or the like interrupts the first write operations and is performed. FIG. 12 shows an example in which after the first write operations in the memory transistors MTr1 to MTr4 connected to the respective word-lines WL1 to WL4 are completed, the read operation is performed. With reference to FIG. 12, like FIG. 10, the control circuit 205 performs the erase operation (Erase), and then successively performs the first write operations (Erase, EP Prog for MTr1-4). When, during the first write operations, the host computer 400 has an access regarding the read operation, the control circuit 205 receives the interruption command CMDb from the controller 300. Then, the control circuit 205 interrupts, in response to the interruption command CMDb, the successive first write operations. Then, the control circuit 205 receives the status command CMDst. In response to the status command CMDst, the control circuit 205 outputs the erase status ST to the controller 300. In so doing, along with the output of the erase status ST, the control circuit 205 stores the interruption information in the region AR in the status register 207 in the memory chip 200 (see FIG. 2). The interruption information is related to the state in which the first write operations are interrupted. Here, the interruption information indicates that the first write operations are performed to the memory transistors MTr1 to MTr4, and the first write operations are not performed to the memory transistors MTr5 to MTr8.

Then, the control circuit 205 receives a read address input command CMDradd and an address data ADDr. Then, the control circuit 205 receives the read command CMDr, and performs the read operation to the memory transistor MTr in the address assigned by address data ADDr (Read). Then, the control circuit 205 outputs read data Data.

Then, the control circuit 205 receives the resume command CMDs from the controller 300, thereby resuming the first write operations to the remaining memory transistors MTr5 to MTr8 to which the first write operations are not performed (EP Prog for MTr5-8). Here, the control circuit 205 reads the interruption information from the status register 207. According to the interruption information, the control circuit 205 resumes the first write operations from the memory transistor MTr5.

As described above, this embodiment may provide a non-volatile semiconductor memory device that may have improved reliability of data held in the memory transistor (the memory cell).

The non-volatile semiconductor memory device according to this embodiment is discussed using, as a comparative example, a non-volatile semiconductor memory device in which the erase operation is continuously followed by the first write operations and then the read operation and the second write operation may be performed.

In the comparative example, the read operation and the second write operation are performed after the first write operations are completed. In other words, this increases the total time of the erase operation and the first write operations, thereby having to wait for the next read operation and the second write operation for a long period of time.

However, the non-volatile semiconductor memory device according to this embodiment performs the first write operation during the idle state. In other words, when the read operation and the second write operation are not performed, the erase operation is followed by the first write operations. When the first write operations are interrupted by the read operation or the second write operation, the interrupt operation is prioritized. Then, when the interrupt operation is completed and the idle state occurs, the first write operations are resumed.

As a result, the next read operation and second write operation may be performed after the erase operation, thereby not having to wait for the execution time of the first write operations. The non-volatile semiconductor memory device according to this embodiment may perform the read operation and the second write operation more quickly after the erase operation than the device in the comparative example. As a result, the non-volatile semiconductor memory device according to this embodiment may have improved performance compared to the device in the comparative example.

Second Embodiment

A non-volatile memory system according to a second embodiment will now be described. The configuration of the second embodiment is similar to that of the first embodiment and thus its description is omitted here. As described below, the second embodiment has different first write operations from the first embodiment.

Figure 13:
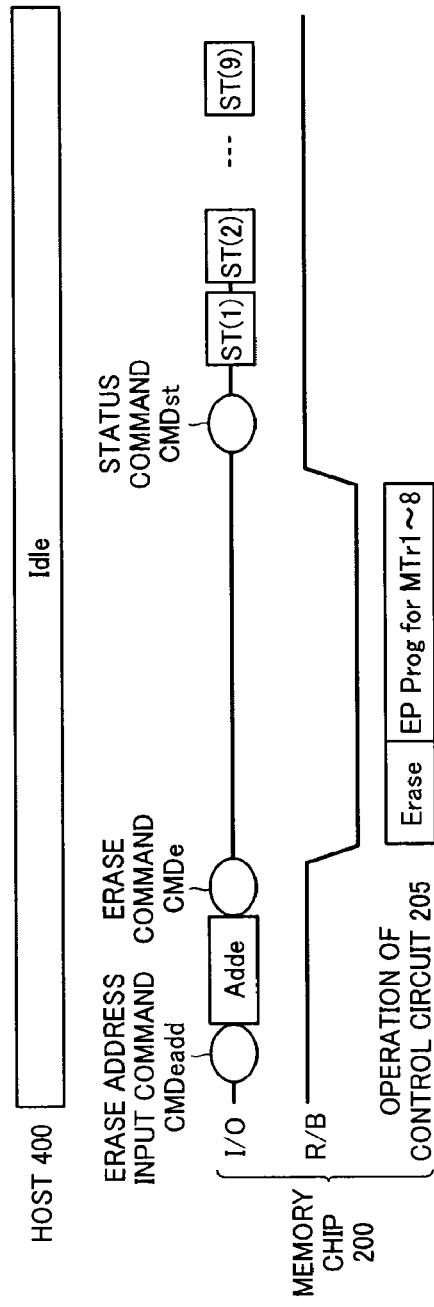
FIG. 13 is the timing diagram of the first write operation according to a second embodiment.

Referring first to FIG. 13, an example is described in which the erase operation and the first write operations are performed without an interruption. Here, in the above first embodiment, in response to one status command CMDst, one erase status ST is output to the controller 300. Because, however, the erase status ST does not include information (interruption information) indicating whether the first write operation is completed or not for each memory transistor MTr, the controller 300 may not identify the state where the first write operations are interrupted. In contrast, in the second embodiment, with reference to FIG. 13, in response to one status command CMDst, a plurality of erase statuses ST(1), (2), . . . are output to the controller 300. The first erase status ST(1) indicates whether the erase operation passes or fails. Second or subsequent erase statuses ST(2), (3), . . . , each include information (interruption information) indicating whether the first write operations to the memory transistors MTr1, MTr2, . . . , connected to the respective word-lines WL1, WL2, . . . , are completed or not, and information indicating whether each first write operation passes or fails. Because this embodiment provides 8 word-lines WL1 to WL8, 9 erase statuses (1) to (9) are output to and stored in the controller 300. Therefore, these erase statuses ST(1), . . . , (9) may allow the controller 300 to identify the state where the first write operations is interrupted and identify the defective memory transistor MTr.

Referring now to FIG. 14, an example of the erase statuses ST(1) and ST(2) will be described. The erase status ST(1) is indicated by, for example, 1-bit data, and the erase status ST(2) is indicated by, for example, 2-bit data. FIG. 14 illustrates the correspondence between the configurations of the erase statuses ST(1) and ST(2) and I/O0 to I/O7.

The first bit data (corresponding to I/O0) of the erase status ST(1) is data indicating whether the erase operation passes or fails. The first bit data (corresponding to I/O0) of the erase status ST(2) is data indicating whether the first write operation is completed or not to the memory transistor MTr1. And, the second bit data (corresponding to I/O1) of the erase status ST(2) is data indicating whether the first write operation to the memory transistor MTr1 passes or fails. Note that the erase statuses ST(3) to ST(9) are only different from the erase status ST(2) in that the target memory transistor MTr is different, and thus their detailed description is omitted here.

Figure 15:
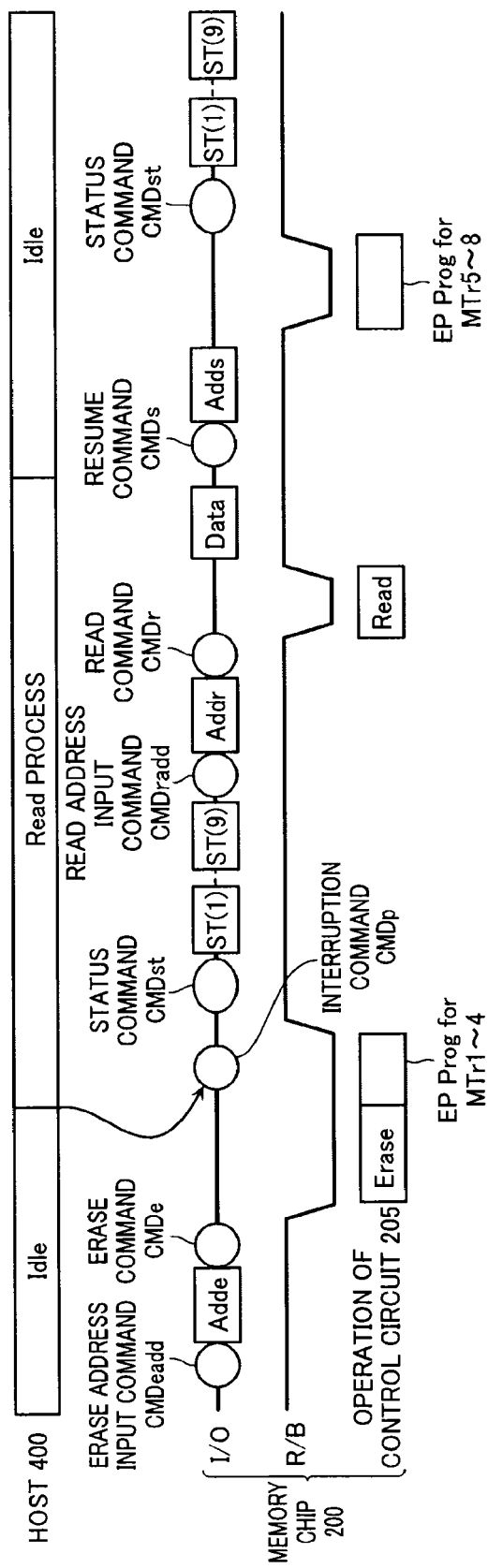
FIG. 15 is a timing diagram of the first write operation according to the second embodiment.

Referring now to FIG. 15, an example is described in which the read operation or the like interrupts the first write operations and is performed. FIG. 15 shows an example in which after the first write operations to the memory transistors MTr1 to MTr4 connected to the respective word-lines WL1 to WL4 are completed, the read operation is performed. With reference to FIG. 15, after the read operation Read, the control circuit 205 receives, from the controller 300, the resume command CMDs for resuming the first write operation, and an address Adds, and then resumes the first write operations from the memory transistor MTr5 assigned by the address Adds. Here, as described above, the controller 300 stores, according to the erase statuses ST(1), . . . , ST(9), whether the first write operation is completed or not (the interruption information) for each of the memory transistors MTr1 to MTr8. Thus, the controller 300 may generate the address Adds when the first write operations are resumed.

As described above, in the second embodiment, the interruption information of the first write operations is held in the controller 300 according to the erase statuses ST(1) to ST(9). Thus, in the second embodiment, unlike the first embodiment, it is not necessary to hold the interruption information in the memory chip 200 (the status register 207).

Note that the non-volatile semiconductor memory device in the second embodiment may provide a similar advantage to that in the first embodiment.

Third Embodiment

A non-volatile memory system according to a third embodiment will now be described. The configuration of the third embodiment is similar to that of the first embodiment and thus its description is omitted here. As described below, the third embodiment has different first write operations from the first embodiment.

Figure 16:
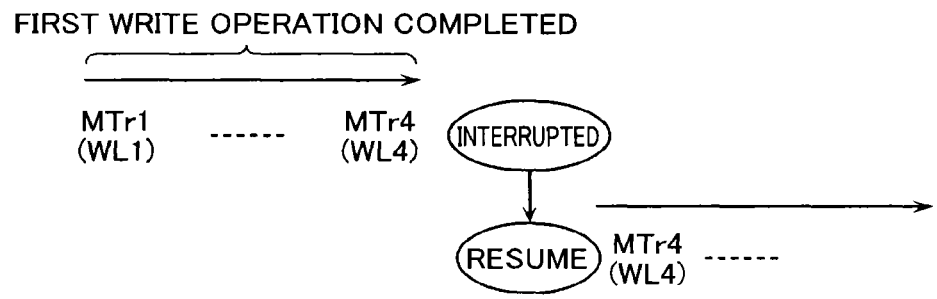
FIG. 16 illustrates a process when after the first write operations to the memory transistors MTr1 to MTr4 connected to the respective word-lines WL1 to WL4 are completed, the first write operation is interrupted according to a third embodiment.

FIG. 16 illustrates a process when the first write operation is interrupted, after the first write operations to the memory transistors MTr1 to MTr4 connected to the respective word-lines WL1 to WL4 are completed, in the third embodiment. In the first embodiment, when the first write operations are completed up to the memory transistor MTr4, the first write operation is resumed from the memory transistor MTr5. In contrast, in the third embodiment, with reference to FIG. 16, the first write operation is resumed from the memory transistor MTr4. Further, in the third embodiment, when resuming, the first write operation to the memory transistor MTr4 is performed after a verify operation determining whether or not the threshold of the memory transistor MTr4 is set to a predetermined value.

The reason for resuming the first write operation as shown in FIG. 16 will now be described. As described above, if after the first write operations to the memory transistors MTr1 to MTr4 are completed, the first write operation is interrupted, the charge accumulation layer 43b of the memory transistors MTr1 to MTr4 is in the state in which electrons are trapped. In contrast, the charge accumulation layer 43b of the memory transistors MTr5 to MTr8 remains in the state in which holes are trapped. Thus, charges (electrons or holes) of the memory transistors MTr4 and MTr5 may recombine, thereby reducing the threshold voltage of the memory transistor MTr4. Therefore, the third embodiment resumes the first write operation from the memory transistor MTr4, thereby suppressing the threshold voltage reduction of the memory transistor MTr4. Therefore, the longer time it takes before the first write operation is resumed, the more effective the third embodiment is.

Note that the non-volatile semiconductor memory device in the third embodiment may also provide a similar advantage to that in the first embodiment.

Fourth Embodiment

A non-volatile memory system according to a fourth embodiment will now be described. The configuration of the fourth embodiment is similar to that of the first embodiment and thus its description is omitted here. As described below, the fourth embodiment has different first write operations from the first embodiment.

Figure 17:
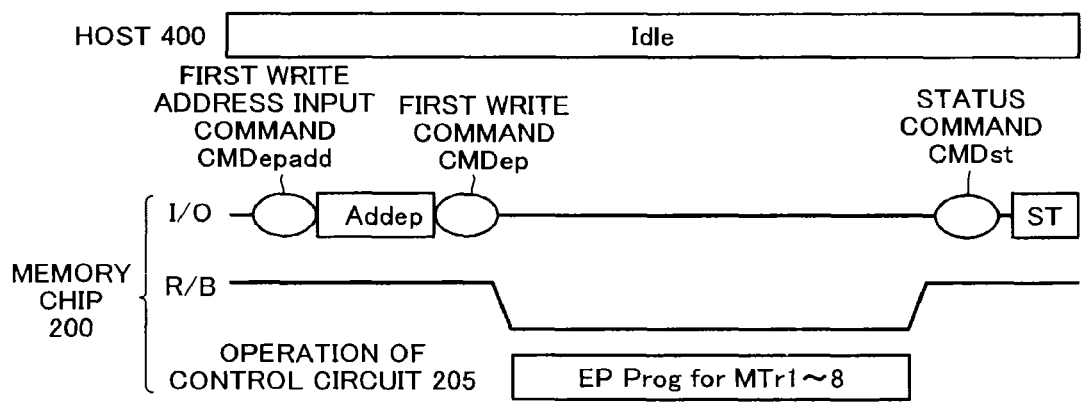
FIG. 17 is a timing diagram of the first write operation according to a fourth embodiment.

Referring first to FIG. 17, an example is described in which the erase operation and the first write operation are performed without an interruption. With reference to FIG. 17, in the fourth embodiment, the control circuit 205 receives, unlike the first embodiment, a first write command CMDep independently from the erase command CMDe. In the fourth embodiment, the erase command CMDe is a command for performing the erase operation, and the first write command CMDep is a command for successively performing the first write operations. In response to the first write command CMDep, the control circuit 205 successively performs the first write operations. After all first write operations are completed, the control circuit 205 receives the status command CMDst. In response to the status command CMDst, the control circuit 205 outputs the erase status ST.

Figure 18:
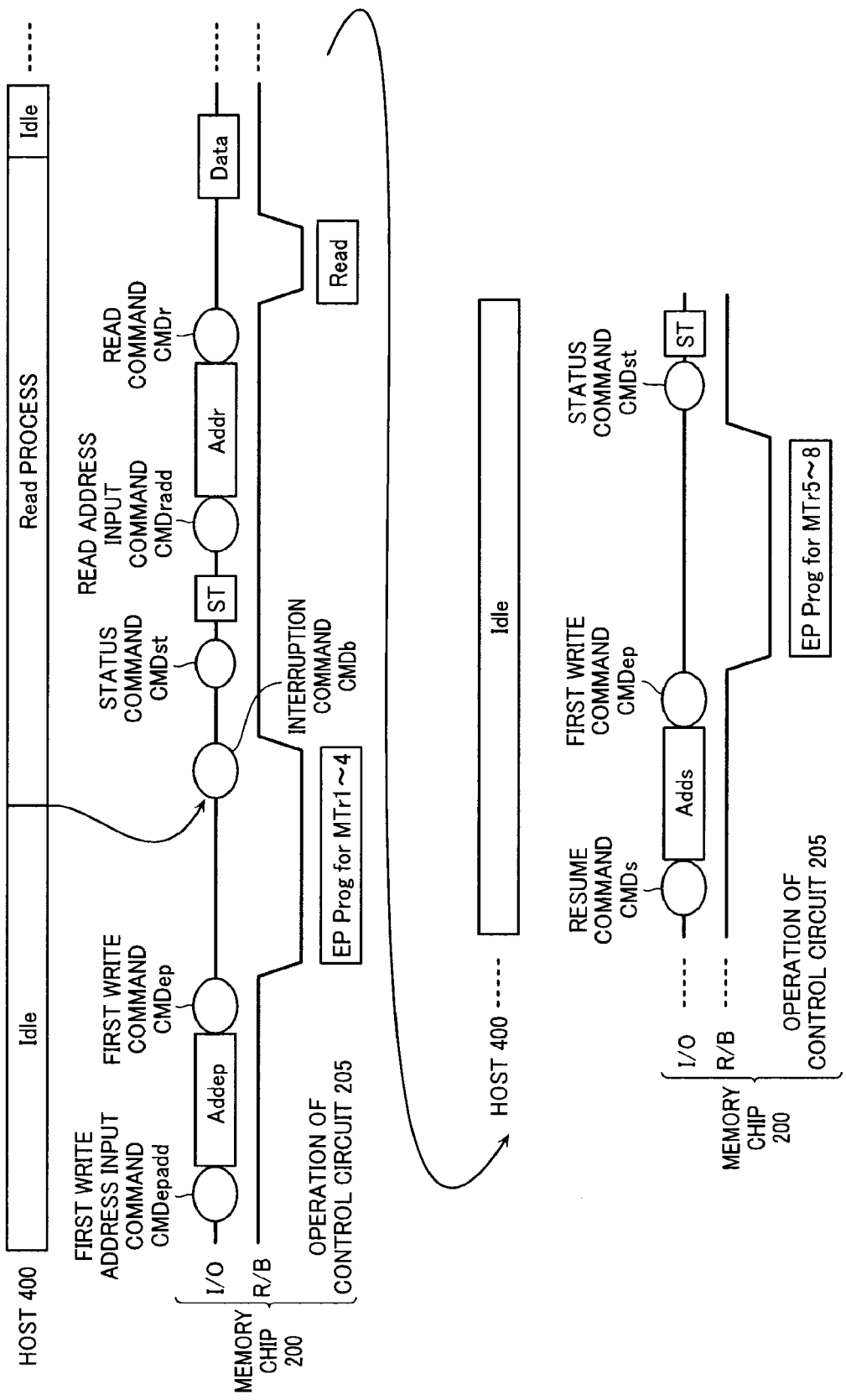
FIG. 18 is the timing diagram of the first write operation according to the fourth embodiment.

Referring now to FIG. 18, an example is described in which the read operation or the like interrupts the first write operations and is performed. FIG. 18 shows an example in which after the first write operations to the memory transistors MTr1 to MTr4 connected to the respective word-lines WL1 to WL4 are completed, the read operation is performed. With reference to FIG. 18, after the read operation Read, the control circuit 205 receives, from the controller 300, a resume command CMDs for resuming the first write operations, and resumes the first write operations from the memory transistor MTr5.

Note that the non-volatile semiconductor memory device in the fourth embodiment may also provide a similar advantage to that in the first embodiment.

Fifth Embodiment

A non-volatile memory system according to a fifth embodiment will now be described. The configuration of the fifth embodiment is similar to that of the first embodiment and thus its description is omitted here. As described below, the fifth embodiment has different first write operations from the first embodiment.

Figure 19:
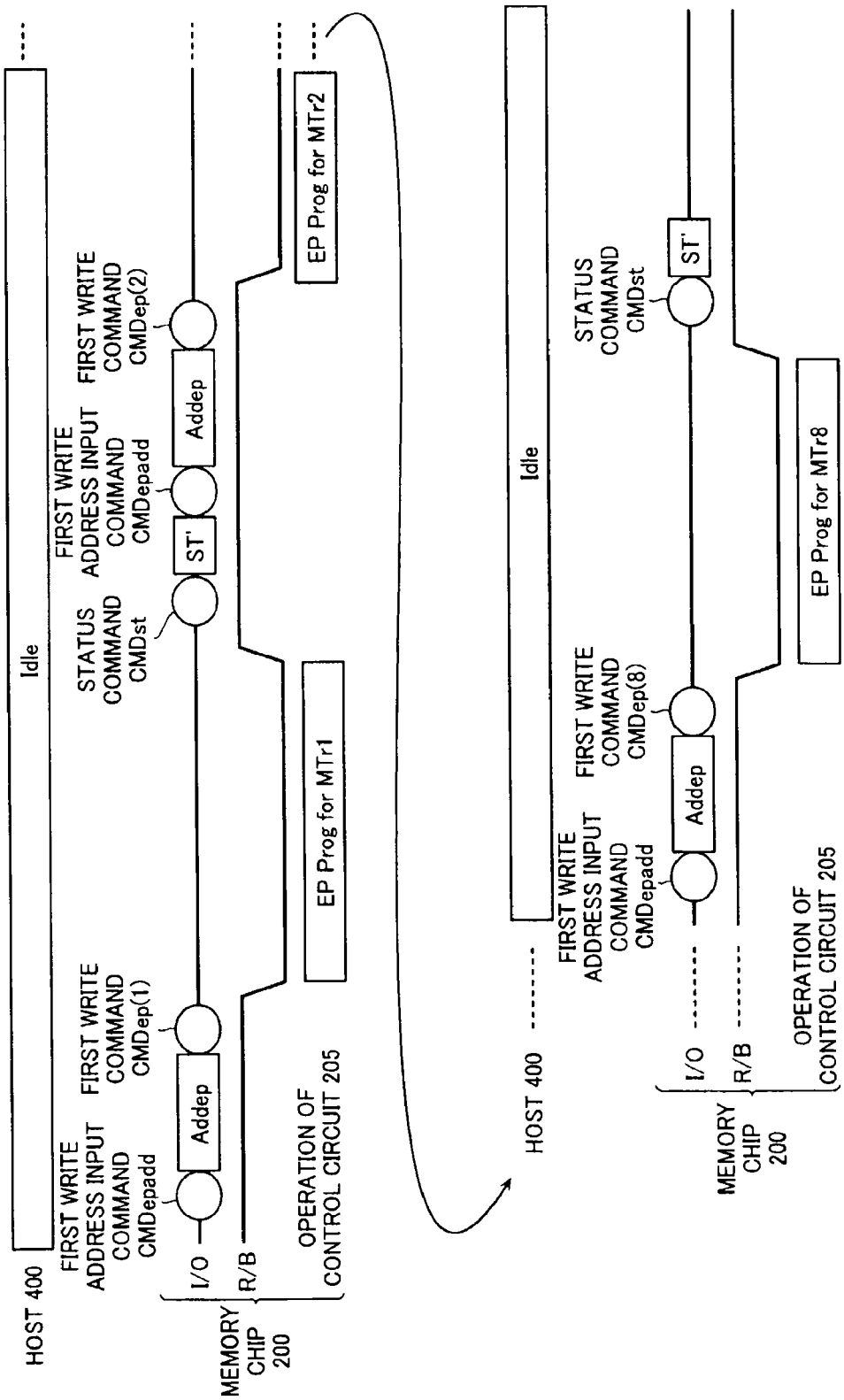
FIG. 19 is a timing diagram of the first write operation according to a fifth embodiment.

With reference to FIG. 19, in the fifth embodiment, the control circuit 205 receives inputs of a plurality of first write commands CMDep(1) to CMDep(8) for performing one first write operation to the respective memory transistors MTr1 to MTr8. Then, the control circuit 205 performs, according to the first write commands CMDep(1) to CMDep(8), the first write operations to the respective memory transistors MTr1 to MTr8. Then, the control circuit 205 receives, after performing the first write operations to the memory transistors MTr1 to MTr8, the status command CMDst. In response to the status command CMDst, the control circuit 205 outputs the erase status ST' to the controller 300. The erase status ST' includes information indicating whether the first write operations are completed or not for the memory transistors MTr1 to MTr8.

In the above fifth embodiment, the first write operations to the memory transistors MTr1 to MTr8 are performed by the respective different first write commands CMDep(1) to CMDep(8). Therefore, the control circuit 205 receives, during the first write operations, the read command CMDr and the write command CMDw, in response to which the control circuit 205 may perform the read operation and the second write operation. Further, because the controller 300 receives the erase status ST' for each first write operation, the controller 300 may identify the memory transistor MTr to which the first write operation is completed.

Here, in the above first to fourth embodiments, the controller 300 needs to issue the interruption command CMDb and the resume command CMDs. In contrast, the fifth embodiment does not need the interruption command CMDb and the resume command CMDs. Therefore, the fifth embodiment may provide shorter processing time than the first to fourth embodiments.

Note that the non-volatile semiconductor memory device in the fifth embodiment may also provide a similar advantage to that in the first embodiment.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above embodiments, the first write operation is performed to a memory transistor MTr that stores four-level data. However, the first write operation may also be performed to a memory transistor MTr that stores binary data as shown in FIG. 20.

Figure 20:
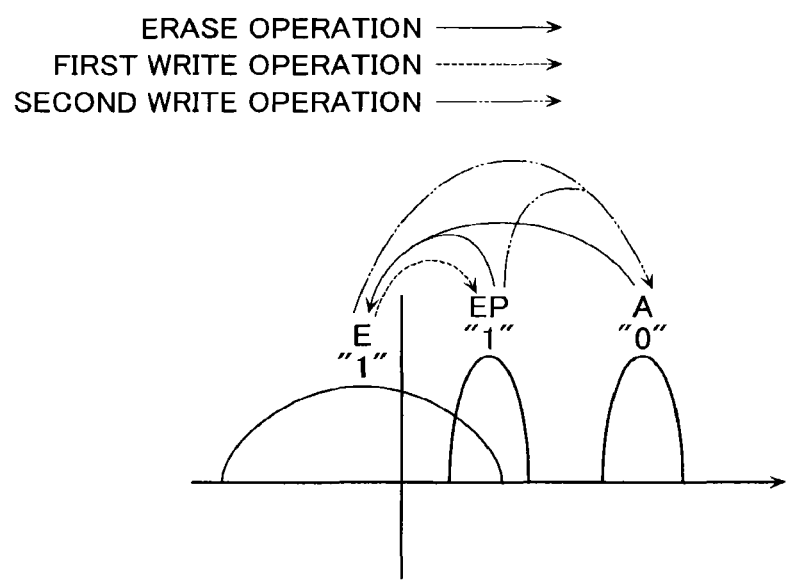
FIG. 20 illustrates a relationship between the threshold voltage distributions of a memory transistor MTr and data according to another embodiment.

FIG. 20 shows a relationship between 1-bit binary data (data "1" and "0") stored in the memory transistor MTr and threshold voltage distributions of the memory transistor MTr. Here, data "1" (E and EP) indicates the erased state, and data "0" (A) indicates the write state. A lower limit of the threshold voltage distribution E has a negative value. The lower limits of the threshold voltage distributions EP and A have positive values. The threshold voltage distributions EP and A are arranged in the positive direction at a predetermined margin.

With reference to FIG. 20, the erase operation causes holes to be trapped in the charge accumulation layer 43b of the memory transistor MTr, thereby moving the threshold voltage distributions EP and A in the negative direction to be set to the threshold voltage distribution E. The first write operation causes electrons to be trapped in the charge accumulation layer 43b of the memory transistor MTr, thereby moving the threshold voltage distribution E in the positive direction to be set to the threshold voltage distribution EP. The second write operation causes electrons to be trapped in the charge accumulation layer 43b of the memory transistor MTr, and move, depending on the trapped amount, the threshold voltage distribution E or EP in the positive direction to be set to the threshold voltage distribution A.

What is claimed is:

1. A non-volatile semiconductor memory device comprising:
    a semiconductor substrate;
    a source line provided above the semiconductor substrate
    a bit line provided above the semiconductor substrate;
    a first select gate line provided above the semiconductor substrate; and
    a second select gate line provided above the semiconductor substrate,
    a plurality of word lines stacked between the semiconductor substrate and the bit line;
    a first semiconductor layer penetrating the first select gate line, the word lines and the second select gate line, and a charge accumulation layer provided between the first semiconductor layer and the first select gate line, between the first semiconductor layer and the word lines and between the first semiconductor layer and the second select gate line, the first semiconductor and the charge accumulation layer forming a first select transistor to a gate of which the first select gate line is connected, a plurality of memory cells to gates of which the word lines are connected, respectively and a second select transistor to a gate of which the second select gate line is connected; and
    a control circuit configured to perform
        an erase operation to bring threshold voltage levels of the memory cells below a first threshold voltage level,
        first write operations to bring the threshold voltage levels of the memory cell above a second threshold voltage level, the first write operation being performed after the erase operation, the second threshold voltage level being higher than the first threshold voltage level, and
        a second write operation to bring at least part of the threshold voltage levels of the memory cells above a third threshold voltage level, the second write operation being performed after the first write operation,
        the third threshold voltage level being higher than the second threshold voltage level,
    wherein
    the control circuit is further configured to
    upon receipt of a suspend command during when the first write operation is being performed, suspend the first write operation,
    upon receipt of a first command after the first write operation has been suspended, perform a first operation, and
    upon receipt of a resume command after the first operation has been performed, resume the first write operation.

2. The non-volatile semiconductor memory device according to claim 1, wherein
    the control circuit
    performs the erase operation and the first write operation upon receipt of an erase command,
    suspends the first write operation upon receipt of the suspend command during when the first write operation is being performed,
    performs the first operation upon receipt of the first command after the first write operation has been suspended,
    resumes the first write operation upon receipt of the resume command after the first operation has been performed, and
    performs the second write operation upon receipt of a write command after the first write operation has been performed.

3. The non-volatile semiconductor memory device according to claim 1, wherein
    the control circuit
    performs the erase operation upon receipt of an erase command,
    performs the first write operation upon receipt of a first write command after the erase operation has been performed,
    suspends the first write operation upon receipt of the suspend command during when the first write operation is being performed,
    performs the first operation upon receipt of the first command after the first write operation has been suspended,
    resumes the first write operation upon receipt of the resume command after the first operation has been performed, and
    performs the second write operation upon receipt of a second write command after the first write operation has been performed.

4. The non-volatile semiconductor memory device according to claim 1, wherein
    the first operation is an operation selected from a group, the group consisting of:
    a read operation;
    a write operation; and
    a status information output operation.

5. The non-volatile semiconductor memory device according to claim 1, further comprising
    a storage portion configured to store interruption information,
    wherein
    the interruption information indicates a timing at which the first write operation is suspended, and the control circuit resumes the first write operation based on the interruption information.

6. The non-volatile semiconductor memory device according to claim 5, wherein
the control circuit transmits the interruption information to outside upon receipt of an inquiry command.

7. The non-volatile semiconductor memory device according to claim 1, wherein
the first select transistor, the memory cells and the second select transistor form a memory string, and
the memory cells includes
a plurality of series-connected first memory cells one end of which is connected to the first select transistor, and
a plurality of series-connected second memory cells one end of which is connected to the second select transistor,
the memory string further includes a back gate transistor provided between the other end of the first memory cells and the other end of the second memory cells.

8. The non-volatile semiconductor memory device according to claim 1, wherein
each of the memory cells is capable of storing 2 bits or more of data after the second write operation.

9. The non-volatile semiconductor memory device according to claim 1, wherein
each of the memory cells is capable of storing 1 bit of data after the second write operation.

10. The non-volatile semiconductor memory device according to claim 2, wherein
the first command is a command selected from a group consisting of a read command, the write command, and a status inquiry command,
the suspend command is different from the read command, the write command, the erase command, and the status inquire command, and
the resume command is different from the read command, the write command, the erase command, the status inquire command and the suspend command.

11. The non-volatile semiconductor memory device according to claim 1, further including:
a tunnel insulating layer provided between the charge accumulation layer and the first select gate line, between the charge accumulation layer and the word lines and between the charge accumulation layer and the second select gate line; and
a block insulating layer provided between the first semiconductor layer and the charge accumulation layer.

* * * * *